United States Patent
Miyazaki

(10) Patent No.: US 6,258,640 B1
(45) Date of Patent: Jul. 10, 2001

(54) SEMICONDUCTOR DEVICE MANUFACTURING METHOD

(75) Inventor: Shuji Miyazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/353,318

(22) Filed: Jul. 14, 1999

(30) Foreign Application Priority Data

Jul. 14, 1998 (JP) .................................................. 10-198532

(51) Int. Cl.⁷ .................................................. H01L 21/336
(52) U.S. Cl. ........................ 438/197; 438/239; 438/241
(58) Field of Search .................................. 438/197, 239, 438/241, 253, 254, 381, 396, 240, 380, 382, 395

(56) References Cited

U.S. PATENT DOCUMENTS

| 5,162,241 | * | 11/1992 | Mori et al. | 438/402 |
| 5,843,817 | * | 12/1998 | Lee et al. | 437/239 |
| 5,963,829 | * | 10/1999 | Matsubara | 438/649 |

FOREIGN PATENT DOCUMENTS

| 5-110031 | 4/1993 | (JP) . |
| 7-283304 | 10/1995 | (JP) . |
| 7-321120 | 12/1995 | (JP) . |
| 8-78633 | 3/1996 | (JP) . |
| 9-64194 | 3/1997 | (JP) . |
| 9-148570 | 6/1997 | (JP) . |
| 10-92920 | 4/1998 | (JP) . |

\* cited by examiner

*Primary Examiner*—David Nelms
*Assistant Examiner*—Dung A Le
(74) *Attorney, Agent, or Firm*—McGinn & Gibb, PLLC

(57) ABSTRACT

A well region is formed in a semiconductor substrate, the surface of the semiconductor substrate is thermally oxidized to thereby form a device isolation insulating film, impurities are injected into the semiconductor substrate to form a guard ring immediately below the device isolation insulating film and then the RTA is conducted to rapidly heat the semiconductor substrate at a temperature higher than that for thermal oxidation. Thereafter, a MOS transistor and a capacitor are formed by, for example, injecting impurities into the semiconductor substrate and then hydrogen sintering as an interface trapped state lowering treatment is conducted. Since the crystal defects are repaired by the RTA without affecting the impurity profile and the interface trapped state is reduced by the interface trapped state lowering treatment, leak current on the device isolation insulating film is reduced. As a result, it is possible to improve the crystal defects and the interface trapped state on the device isolation insulating film in the semiconductor device, thereby suppressing leak current on the device isolation insulating film and eliminating the influence of RTA on the impurity profile.

26 Claims, 12 Drawing Sheets

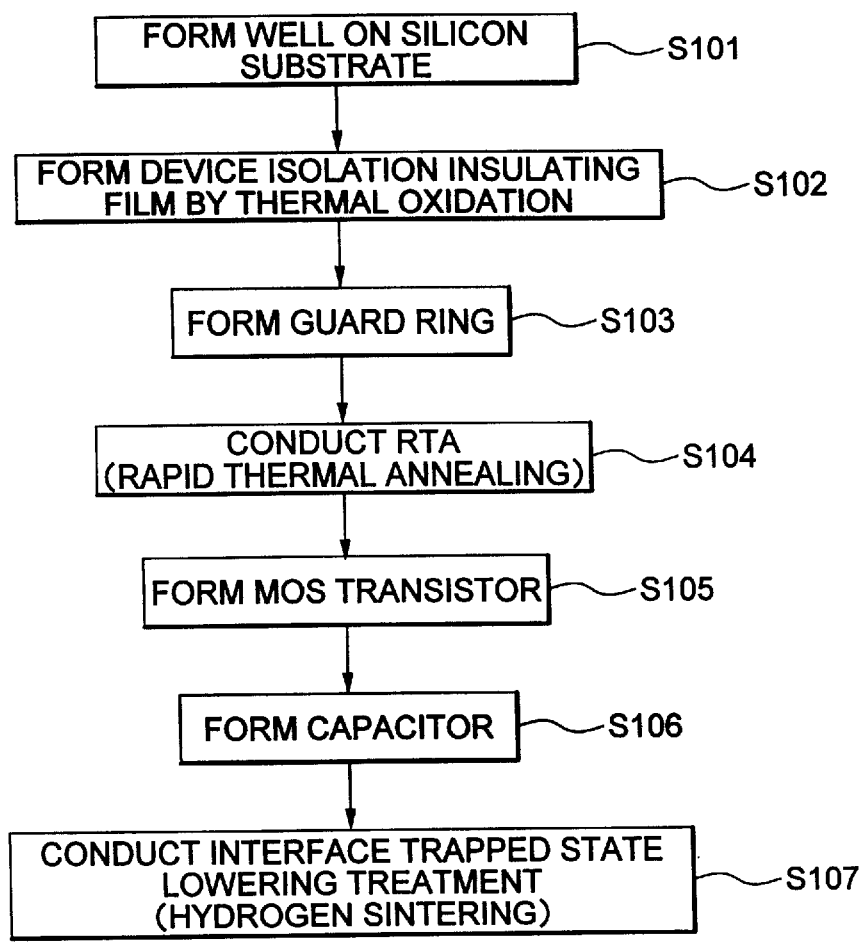

X-X

Y-Y

RTA(1050°C, 30SECONDS)

FA(1050°C, 10 MINUTES)

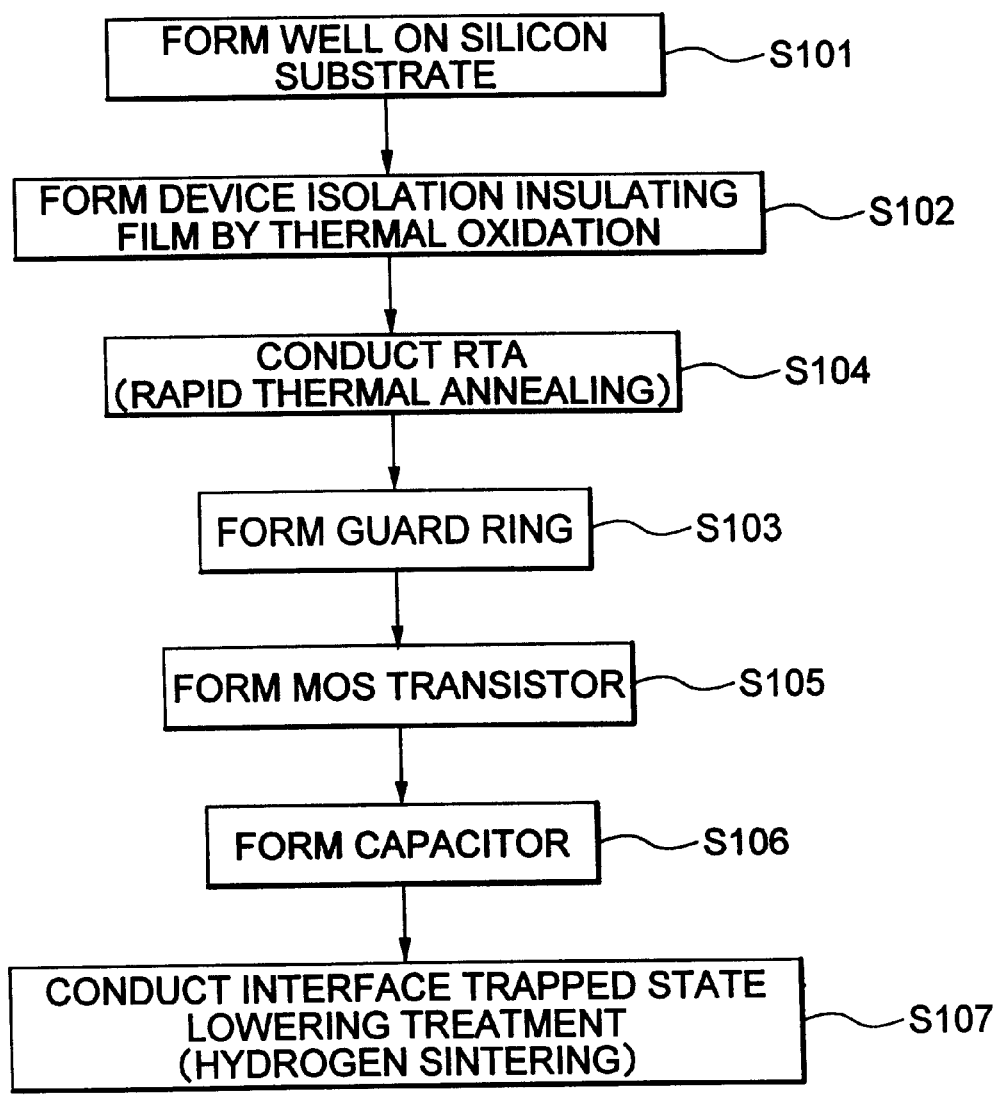

SEMICONDUCTOR DEVICE MANUFACTURING METHOD

BACKGROUND OF THE INVENTION

1. Field of the Invention

The present invention relates to a semiconductor device manufacturing method, in particular to a method of manufacturing a semiconductor device capable of reducing leak current in a device isolation region.

2. Description of the Related Art

In a semiconductor device, while the main surface of a semiconductor substrate is separated into device formation regions which are mutually electrically independent by a device isolation insulating film, current is often generated by the interface trapped state and/or crystal defects at the semiconductor/insulating-film interface to increase leak current. For example, in case of manufacturing a one-transistor type DRAM, the surface of a P-type silicon substrate is selectively oxidized by the LOCOS method to form a device isolation insulating film consisting of a silicon oxide film and form device formation regions divided by the device isolation insulating film. A gate insulating film and a gate electrode are formed in the device formation region and N-type impurity ions are implanted into the device formation region of the silicon substrate to thereby form a source region and a drain region. After forming an interlayer insulating film, a contact hole is formed in the source region, and a capacitance electrode for information storage, a capacitance insulating film and an opposing electrode serving as a data line are formed in the contact hole to thereby constitute a memory cell. In this DRAM, however, since the source region is formed in a region adjacent to the device isolation insulating film, the information stored in the capacitance electrode leaks from the source region through the interface between the device isolation insulating film and the semiconductor substrate, with the result that the holding characteristics of stored information to be recorded deteriorates. It is considered that leak current is generated because the device isolation insulating film formed by selective oxidation in the step of forming the device isolation insulating film causes the formation of the interface trapped state between the device isolation insulating film and the semiconductor substrate and crystal defects occur at the interface. considering this, a so-called interface trapped state lowering treatment for conducting a heat treatment at a temperature of 400 to 450° C. for about 10 to 100 minutes under, for example, $H_2$ atmosphere is conventionally conducted in a step after the device isolation insulating film is formed, so as to suppress leak current. There has also been proposed a heat treatment to repair the crystal defects at the interface.

As a heat treatment for repairing the crystal defects at the interface, annealing process for heating the substrate for relatively a long time using a furnace (this annealing using the furnace is referred to as "FA" hereinafter) is conventionally adopted. However, the FA which requires a long heating time, sometimes causes the redistribution of the impurity profile for an impurity diffused layer formed on the semiconductor substrate and the deterioration of device characteristics. For example, in the DRAM as described above, when the device having a guard ring formed immediately below the device isolation insulating film is subjected to FA, the effect of reducing leak current immediately below the device isolation insulating film can be obtained. However, the impurities of one conductivity type which constitute the guard ring immediately below the device isolation insulating film are diffused into the active region of the MOS transistor formed adjacent to the guard ring by this FA to thereby make the interface smoother, and particularly to narrow the channel width in gate width direction and deteriorate the transistor characteristics. Also, when the FA treatment is carried out after the source and drain region for the MOS transistor are formed, the impurity profile for the source and drain region is made smoother, to thereby decrease the channel length and deteriorate the transistor characteristics.

As can be seen from the above, according to the conventional semiconductor device manufacturing method, leak current caused by the interface trapped state and crystal defects generated during the formation of the device isolation insulating film, becomes conspicuous. Even if an interface trapped state lowering treatment is carried out, it is difficult to reduce the leak current which is considered to be resulted from the crystal defects. Moreover, if FA is conducted to repair the crystal defects, the impurity profile for the impurity layer formed on the semiconductor substrate is adversely affected to thereby deteriorate device characteristics. As a result, the FA for repairing the crystal defects is conventionally limited such that the step is conducted before the formation of the impurity layer. In the actual semiconductor substrate, however, the step of forming a device isolation insulating film is mainly conducted after forming the P-type well region or N-type well region in the semiconductor substrate and the impurity layer is already formed by the time when the device isolation insulating film is formed. Furthermore, there is recently proposed forming well regions only by ion implantation with high energy, which method disadvantageously makes the impurity profile for the high temperature heat treatment conducted in a later step smoother. For these reasons, it is substantially impossible to repair the crystal defects by conducting the FA without affecting the impurity profile.

SUMMARY OF THE INVENTION

It is an object of the present invention to provide a semiconductor device manufacturing method capable of improving the crystal defects at the insulating-film/semiconductor interface to thereby suppress leak current on the device isolation insulating film and capable of eliminating any influence on the impurity profile to thereby improve transistor characteristics.

In a semiconductor device manufacturing method according to the present invention, the surface of a semiconductor substrate is thermally oxidized to form a device isolation insulating film. After forming the device isolation insulating film, RTA (or Rapid Thermal Annealing) is conducted to rapidly heat the semiconductor substrate at a temperature higher than a temperature at which the semiconductor substrate is thermally oxidized. Impurities are injected into the semiconductor substrate before or after the RTA step. Then, an interface trapped state lowering treatment is conducted. When the present invention is applied to, for example, a method of manufacturing a memory cell comprising a MOS transistor and a capacitor, a semiconductor device manufacturing method according to the present invention, comprising the steps of forming at least one well region of a conductivity type in a semiconductor substrate; selectively thermally oxidizing a surface of the semiconductor substrate to form a device isolation insulating film including a thermally oxidized film and forming a device formation region on the semiconductor substrate by the device isolation insulating film; injecting high concentration impurities of one conductivity type into at least the device isolation insulating film and forming a channel stopper immediately below the device isolation insulating film; forming a gate insulating film and a gate electrode in the device formation region; while using the device isolation insulating film and the gate electrode as masks, injecting impurities of a conductivity type opposite to a conductivity type of the device formation region to the device formation region and forming a source region and a drain region; forming an interlayer insulating film covering the device formation region, forming a contact hole in the interlayer insulating film and forming a capacitance electrode electrically connected to the source region through the contact hole; forming a capacitance insulating film and an opposing electrode on the capacitance electrode to thereby constitute a capacitor; and conducting an interface trapped state lowering treatment to the semiconductor substrate, is characterized by comprising the step of conducting a rapid thermal annealing to the semiconductor substrate at a temperature higher than a temperature at which the device isolation insulating film is thermally oxidized, the step conducted between appropriate steps including the step immediately after the step of forming the device isolation insulating film to a step of conducting a low temperature heat treatment under hydrogen atmosphere.

The respective steps of the present invention are preferably the following steps. That is, the RTA is conducted by a heat treatment using a furnace capable of increasing and decreasing temperature. The temperature at which the thermally oxidized film is formed is between 800° C. and 1100° C. and the rapid heating treatment is conducted at a temperature higher than 950° C. at a speed of increasing and decreasing the temperature of 1° C./second or faster. As the step of forming the device isolation insulating film, either a step of selectively oxidizing the surface of the semiconductor substrate and forming a thick, thermally oxidized film or a step of forming a depressed groove in the surface of the semiconductor substrate, thermally oxidizing an internal surface and a bottom surface of the depressed groove to thereby form a thermally oxidized film, and embedding an insulating material or other material in the depressed groove can be adopted. In addition, the interface trapped state lowering treatment is a low temperature heat treatment using hydrogen.

The crystal defects at the interface between the device isolation insulating film and the semiconductor substrate are repaired by conducting the RTA at a temperature higher than the thermal oxidation temperature for forming a thermally oxidized film, and the interface trapped state on the semiconductor substrate immediately below the device isolation insulating film is reduced by conducting the interface trapped state lowering treatment, thereby reducing leak current on the device isolation insulating film. In addition, due to the rapid heating treatment by the RTA, the impurity profile for the impurity layer formed on the semiconductor substrate is hardly influenced and the deterioration of the characteristics of an device including the impurity layer as a constituent device is prevented.

BRIEF DESCRIPTION OF THE DRAWINGS

FIG. 1 is a flowchart showing a manufacturing method in a first embodiment according to the present invention;

FIG. 8 is a flowchart showing a manufacturing method in a second embodiment according to the present invention;

DETAILED DESCRIPTION OF THE PREFERRED EMBODIMENTS

Now, preferred embodiments according to the present invention will be described in detail with reference to the accompanying drawings. FIG. 1 is a flowchart outlining the manufacturing method in which the present invention is applied to a one-transistor type DRAM in the order of manufacturing steps. In this embodiment, a well region is formed in a semiconductor substrate (step S101) and a device isolation insulating film for the formation of a device formation region is formed (step S102).

Then, impurities are injected into the semiconductor substrate to form a guard ring (or channel stopper) immediately below the device isolation insulating film (step S103), and RTA is conducted to repair crystal defects at the interface between the device isolation insulating film and the semiconductor substrate immediately below the device isolation insulating film (step S104). Thereafter, a gate electrode is formed on the device formation region and impurities are injected thereinto to thereby form a source and drain region and to form a MOS transistor (step S105). After a capacitor for capacity storage is formed (step S106), hydrogen sintering is carried out (step S107) and a DRAM memory is thereby formed.

Figure 2A:
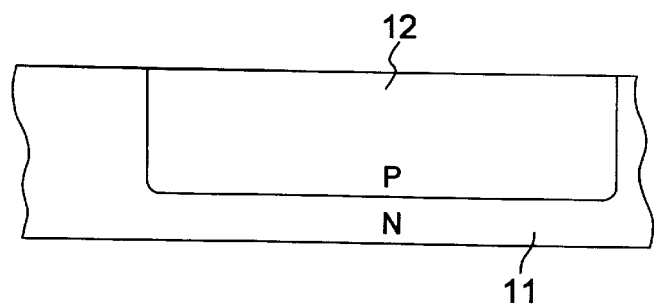
FIGS. 2A through 2K are cross-sectional views showing the method in the first embodiment according to the present invention in the order of manufacturing steps.

FIGS. 2A through 2K are cross-sectional views showing an example of manufacturing a DRAM memory in accordance with the flowchart of FIG. 1 in the order of manufacturing steps. First, as shown in FIG. 2A, P-type impurities are injected and diffused into a predetermined region of an N-type silicon substrate 11 to form a P-type well region 12.

Figure 2B:
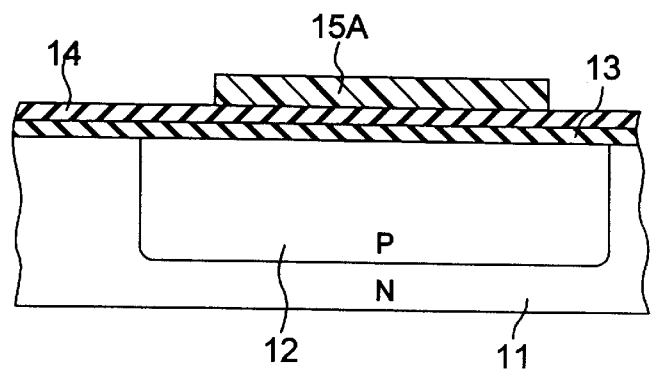

Next, as shown in FIG. 2B, a thin silicon oxide film 13 is formed on the surface of the silicon substrate 11 by thermal oxidation method. A silicon nitride film 14 is formed on the silicon oxide film 13. Then, a photoresist film 15A is formed on the silicon nitride film 14 and a photo resist film 15 is formed into a predetermined pattern by photolithography.

Figure 2C:
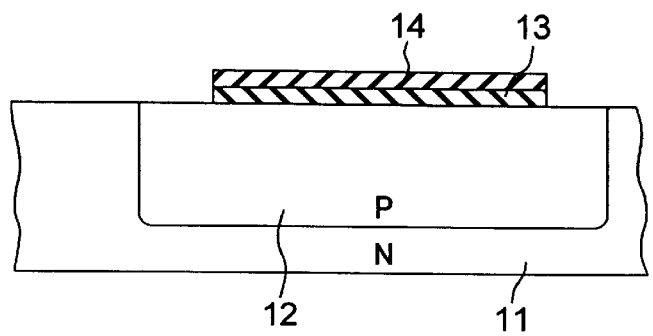

As shown in FIG. 2C, using the photoresist film 15 as a mask, the silicon nitride film 14 and the silicon oxide film 13 are selectively etched to expose the surface of the region of the silicon substrate 11 in which a device isolation insulating film is formed.

Figure 2D:
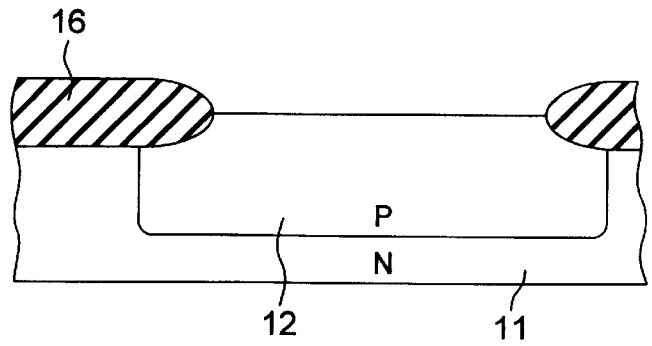

As shown in FIG. 2D, heat treatment (LOCOS oxidation) is conducted at 980° C. to thermally oxidize the exposed surface of the silicon substrate 11, thereby forming a thick silicon oxide film 16 as a device isolation insulating film. After conducting the thermal oxidation, crystal defects of the silicon monocrystals forming the silicon substrate 11 occur to the interface between the device isolation insulating film 16 and the silicon substrate 11 immediately below the device isolation insulating film 16 and the interface trapped state increases.

Figure 2E:
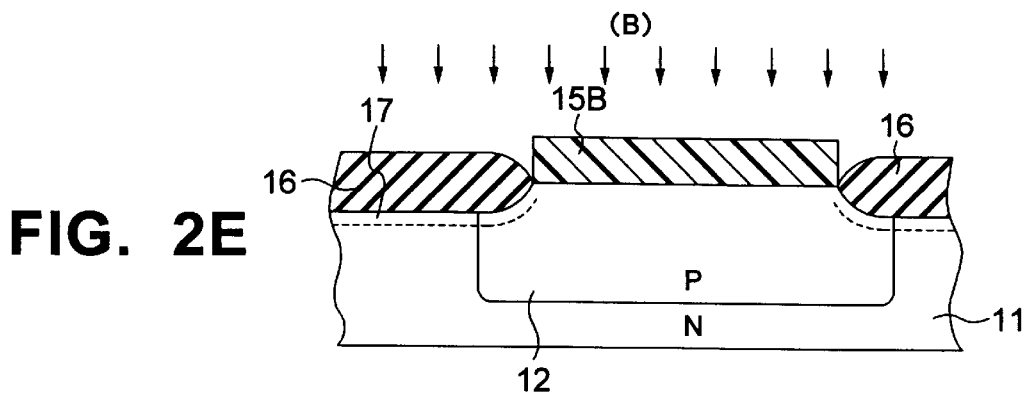

After removing the silicon nitride film 14 and the silicon oxide film 13, boron (B) ions are implanted into the surface of the silicon substrate 11 while using the photoresist 15B as a mask as shown in FIG. 2E. At this time, boron implantation energy and ion dosage are appropriately set, whereby ions are implanted into the depth along the interface between the device isolation insulating film 16 and the silicon substrate 11 and an ion implanted layer 17 is formed. The ion implantation energy is set at 100 keV and ion dosage is set at $2 \times 10^{12}$ (1/cm$^2$). Since the boron ion implanted layer 17, obtained by implanting B ions into the device formation region, is positioned deep in the silicon substrate 11, ion implantation does not affect the characteristics of an MOS transistor to be formed later.

Thereafter, RTA (Rapid Thermal Annealing) is carried out to the silicon substrate 11, i.e., the substrate 11 is rapidly heated and subjected to heat treatment. Here, lamp annealing is used as RTA and the silicon substrate 11 is heated for about 30 seconds at a temperature of 1050° C. higher than the temperature at which the device isolation insulating film 16 is formed, i.e., 980° C. under nitrogen atmosphere. As a result of RTA, crystal defects are repaired at the interface between the device isolation insulating film 16 and the silicon substrate 11 immediately below the film 16.

Figure 2F:
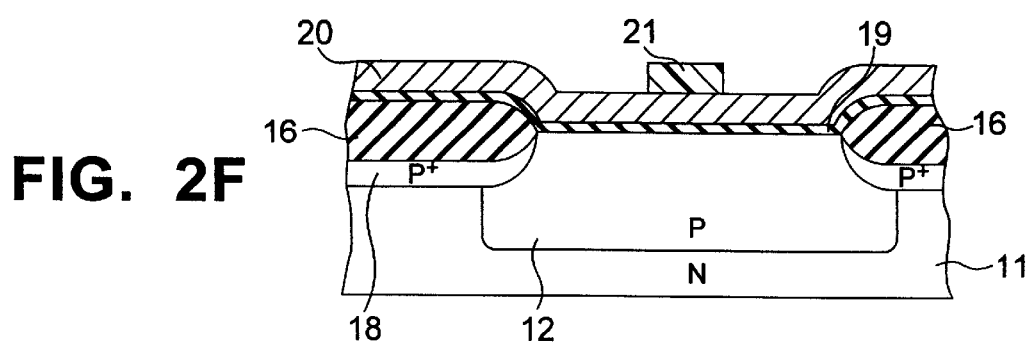

In addition, as a result of the heat treatment, the boron ions implanted layer 17 formed by ion implantation in the preceding step is formed as a highly doped P-type impurity layer along the interface between the device isolation insulating film 16 and the silicon substrate 11 immediately below the film 16 and the P-type impurity layer is formed as a channel stopper, that is, a guard ring 18 for increasing the withstand voltage between devices positioned adjacent to each other with the device isolation insulating film 16 put therebetween, as shown in FIG. 2F.

Next, as shown in FIG. 2F, the surface of the silicon substrate 11 is thermally oxidized to thereby form a silicon oxide film 19 serving as a gate insulating film of about 200 Å in thickness. Then, a first polysilicon film 20 of about 3000 Å in thickness is formed on the silicon oxide film 19. A photoresist film 21 is formed on the first polysilicon film 20. The photoresist film 21 is formed into a mask of required pattern by a photographic technique. Using this mask, the first polysilicon film 20 and the silicon oxide film 19 are selectively etched, thereby forming them into the gate insulating film 19 and the gate oxide film 20, respectively.

Figure 2G:
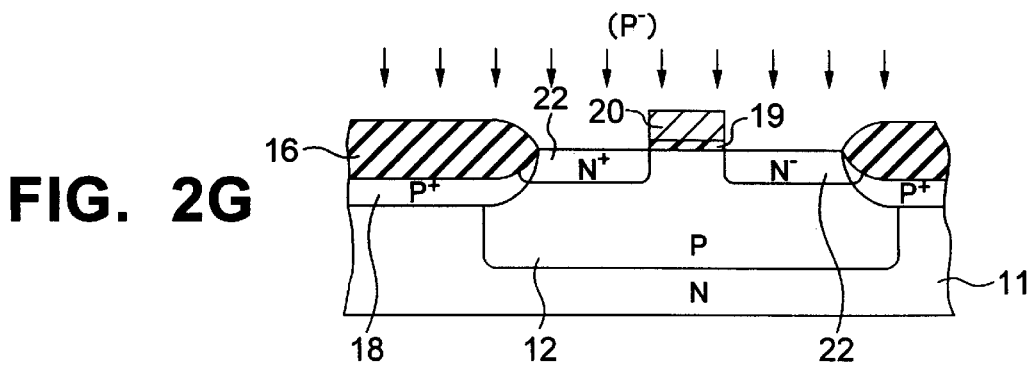

Thereafter, as shown in FIG. 2G, phosphor (P) ions are implanted into the device formation region of the silicon substrate 11 by self-alignment using the device isolation insulating film 16 and the gate electrode 20. At this time, ion implantation energy is set at 30 kev and ion dosage is set at $5 \times 10^{13}$ (1/cm$^2$). The source and drain region 22 can be formed into a so-called LDD structure. In that case, the region 22 can be formed by first lightly doping the silicon substrate 11 with ions such as phosphor ions to form a sidewall on the side of the gate electrode 20 and then highly doping the substrate 11 with arsenic ions.

Figure 2H:
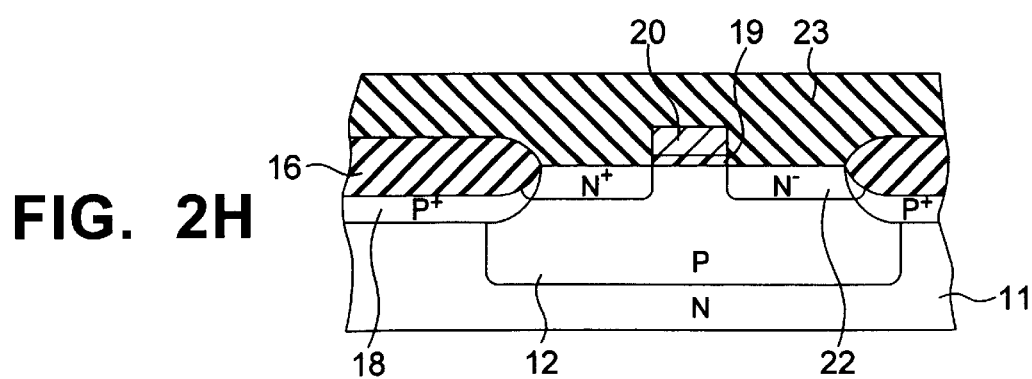

Thereafter, as shown in FIG. 2H, a silicon oxide film of about 1 μm in thickness is formed on the entire surface and an interlayer insulating film 23 is formed.

Figure 2I:
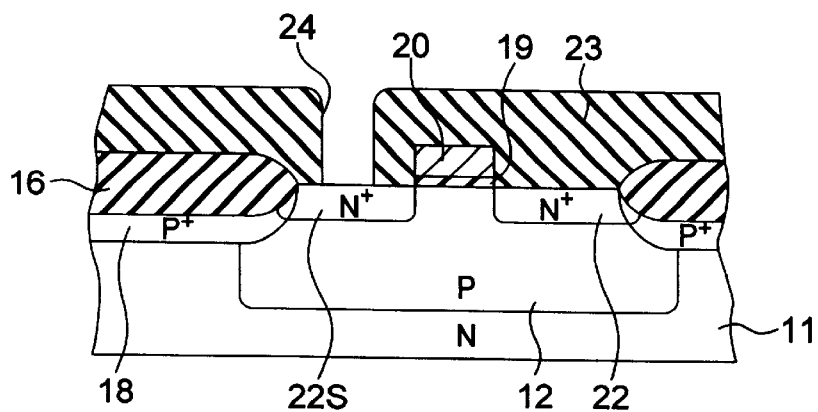

Then, as shown in FIG. 2I, the region of the interlayer insulating film 23 which corresponds to a source region 22S of the source and drain region 22 is selectively etched and a contact hole 24 is formed.

Figure 2J:
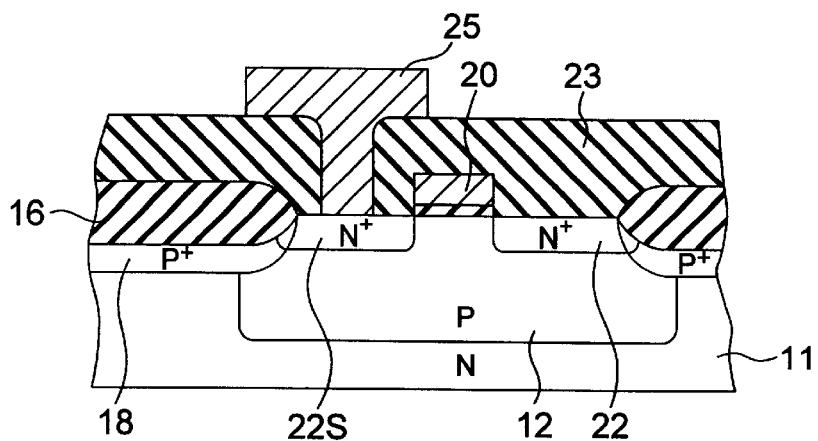

As shown in FIG. 2J, the second polysilicon film 25 is deposited on the entire surface to be filled in the contact hole 24. At the same time, the polysilicon film 25 is selectively etched into a required pattern by photolithography while using the photoresist as a mask, which detailed description will not be given herein. As a result, a second polysilicon film 25 is formed into a capacitance electrode 25 which is electrically connected to the source region 22S.

Figure 2K:
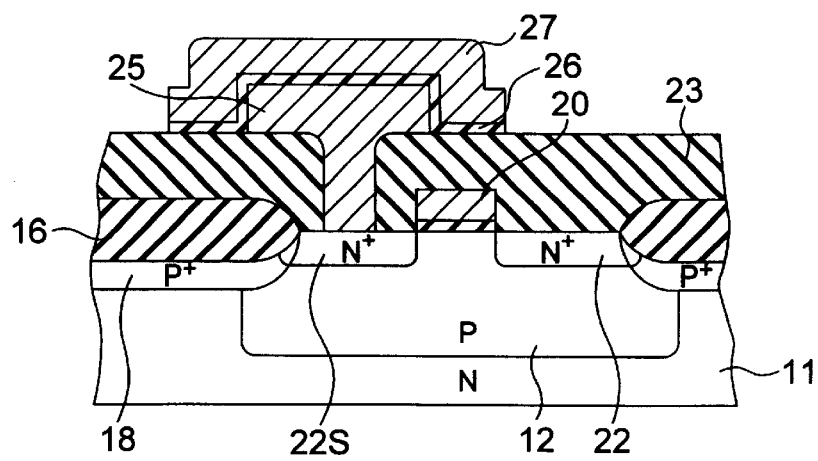

Next, as shown in FIG. 2K, a silicon nitride film 26 is formed on the entire surface and a third polysilicon film 27 is formed on the silicon nitride film 26. The third polysilicon film 27 and the silicon nitride film 26 are selectively etched so as to leave at least the capacitance electrode 25 on the surface, thereby forming a capacitor in which the silicon nitride film 26 serves as a capacitance insulating film and the third polysilicon film 27 serves as an opposing electrode.

After the above series of steps, an interface trapped state lowering treatment, i.e., low temperature heat treatment is conducted for a sintering process under hydrogen atmosphere. After the hydrogen sintering, the interface trapped state of the channel region on the silicon substrate 11 immediately below the gate insulating film 19 is adjusted. By this hydrogen sintering process, the interface trapped state of the interface between the device isolation insulating film 16 and the silicon substrate 11 immediately below the film 16 is also adjusted.

Thus, a DRAM memory cell comprising a MOS transistor and a capacitor is completed through the above steps.

Next, comparison cells are formed through steps part of which differ from the above-stated steps so as to evaluate the characteristics of the memory cell in this embodiment (to be referred to as 'embodiment cell' hereinafter). The result of comparison of characteristics between the embodiment cell and the comparison cells will be described. The following cells were prepared as the comparison cell:

The first comparison cell: obtained by conducting steps which includes an RTA step but not a hydrogen sintering step;

The second comparison cell: obtained by conducting the same steps except for RTA; and The third comparison cell: obtained by conducting steps which do not include RTA and hydrogen sintering steps.

Leakage characteristics and impurity profile characteristics were measured for the embodiment cell and the first to third comparison cells, respectively. Here, the leakage characteristics that electric charges as information stored in the capacitance electrode are passed immediately below the device isolation insulating film and leaked from the source region of a cell to an adjacent cell, were measured by the following method. Reverse current is measured by applying reverse bias (3V) applied between the source region and the substrate. As for the impurity profile characteristics, the spread of a depletion layer which is closely related to the impurity profile, i.e., junction capacity is measured so as to grasp a state in which phosphor ions in the source region and boron ions are mutually diffused to provide a smooth impurity profile.

Figure 3:
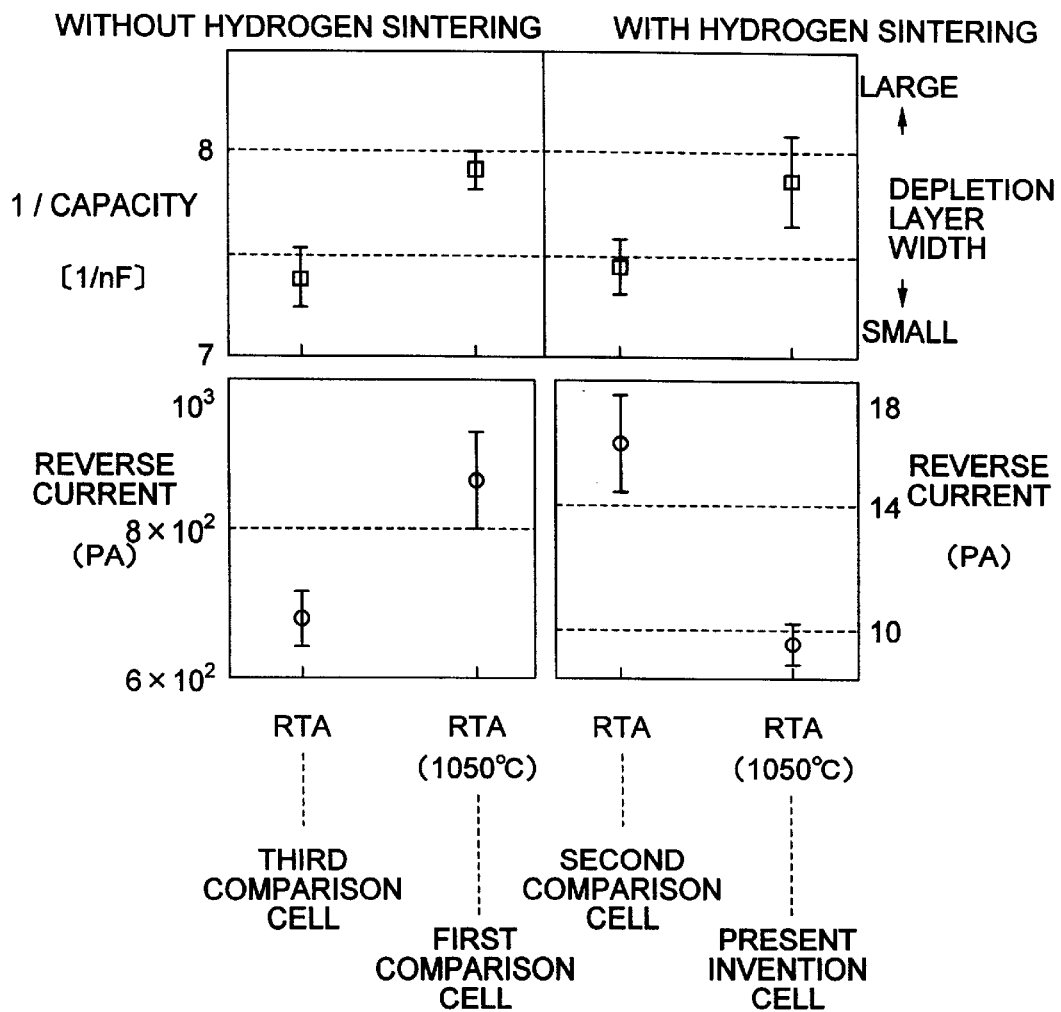
FIG. 3 is a graph showing measurement results of leakage characteristics and impurity profile characteristics in the first embodiment.

FIG. 3 shows the measurement result. As for the leakage characteristics of the first and third comparison cells which were not subjected to hydrogen sintering, it is seen that the leak current of the first comparison cell which was subjected to RTA could be slightly reduced compared to that of the third comparison cell. However, neither of the cells exhibited a leak current reduction effect as expected. Meanwhile, as for the embodiment cell and the second comparison cells which were subjected to hydrogen sintering, it is seen that they had higher leak current reduction effects than those of the first and second comparison cells. In particular, the embodiment cell had far higher leak current reduction effect than that of the second comparison cell. The measurement result confirmed that in the embodiment cell, RTA can effectively repair the crystal defects in the silicon substrate immediately below the device isolation insulating film and can reduce leak current which is considered to be resulted from the crystal defects, i.e., suppress leakage of data from the capacitance electrode in the DRAM memory cell.

As for the impurity profile characteristics, the embodiment cell and the first comparison cell, which were subjected to RTA, showed slightly wider depletion layers in the impurity profile than those of the second and third comparison cells which were not subjected to RTA. The difference between the former and the latter is quite small and it is, therefore, seen that RTA has little effect on smoothing the impurity profile. Also, the impurity profile characteristics were the same, whether or not hydrogen sintering was conducted. It is, therefore, seen that hydrogen sintering hardly influences the impurity profile characteristics.

Figure 4:
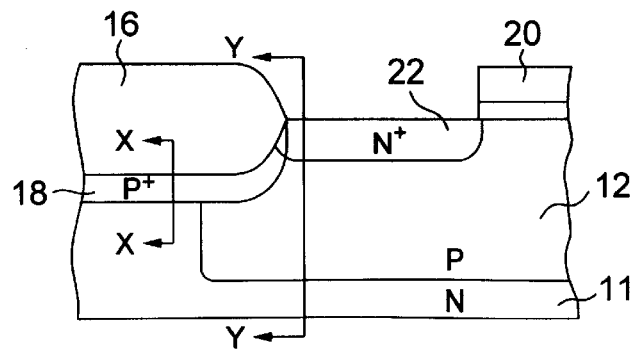
FIG. 4 shows a measurement example for comparing the influence of RTA and FA on the impurity profile.

The result of an experiment to confirm that RTA has little effect on the impurity profile characteristics will be illustrated. FIG. 4 is a typically cross-sectional view showing a case, as in the case of the DRAM memory cell manufactured in the above embodiment, of forming a P-type well region on an N-type silicon substrate, forming a silicon oxide film as a device isolation insulating film on the surface of the silicon substrate, implanting boron ions into the substrate under the same conditions as those for forming the guard ring as stated above and then implanting phosphor ions into the substrate under the same conditions as those for forming the source and drain region. The impurity profile on line X—X and that on line Y—Y on the silicon substrate were then confirmed.

Figure 5A:
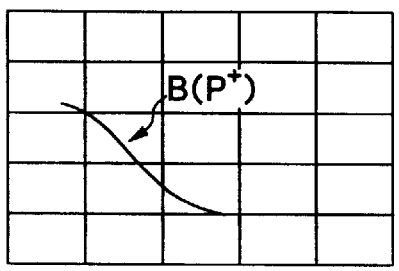
FIGS. 5A through 5C show measurement examples for comparing the influence of RTA and FA on the impurity profile.
Figure 6A:
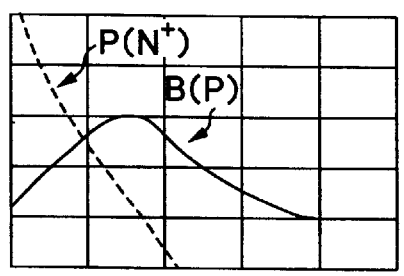
FIGS. 6A through 6C show measurement examples for comparing the influence of FTA and FA on the impurity profile.

FIG. 5A is an impurity profile for the device isolation insulating film, showing that the concentration peak of boron ions exists as the guard ring 18 provided immediately below the device isolation insulating film 16. FIG. 6A is an impurity profile for the device formation region, showing that, if seen from the surface side of the silicon substrate 11 downward, the concentration peak of phosphor ions exists as the source region 22S and then that of boron ions exists as the well region 12. Cells were manufactured through steps including conducting RTA to the silicon substrate under the same conditions as those for RTA stated above (1050° C., 30 seconds) and conducting FA or furnace annealing (1050° C., 10 minutes), respectively. The impurity profiles of the cells were examined.

Figure 5B:
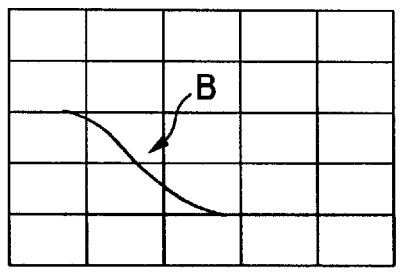
Figure 6B:
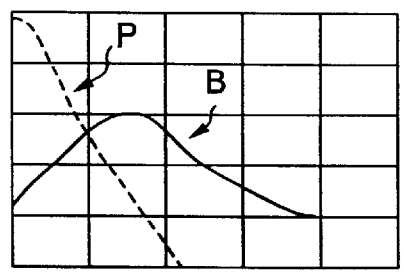
Figure 5C:
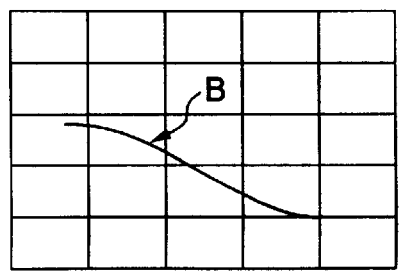
Figure 6C:
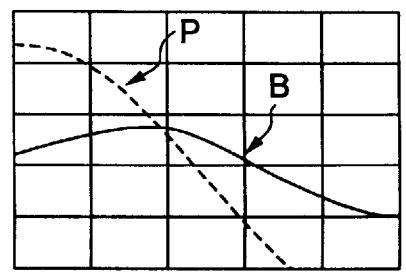

FIGS. 5B and 6B are impurity profiles in case of conducting RTA, showing that impurity profiles did not much change. FIGS. 5C and 6C are impurity profiles in case of conducting FA, showing that the profiles became smoother.

Judging from them, it was confirmed that the effect of RAT on the impurity profile characteristics is very little and negligible.

Figure 7A:
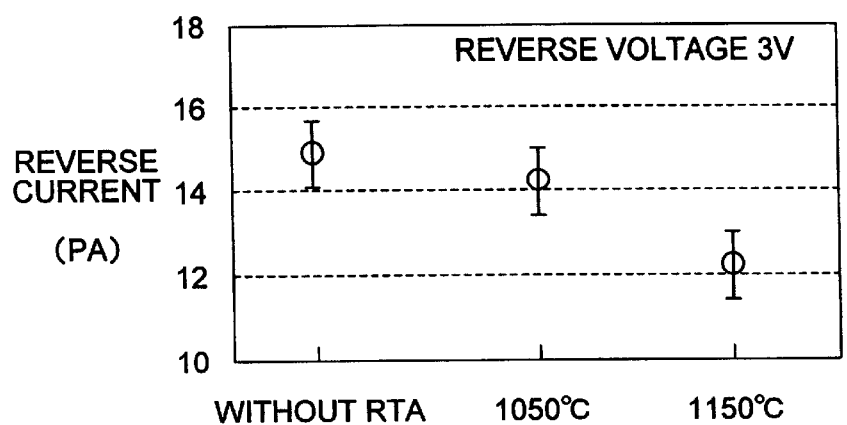
FIGS. 7A and 7B show leakage characteristics and impurity profile characteristics, respectively in case of conducting RTA at different temperatures in the first embodiment.
Figure 7B:
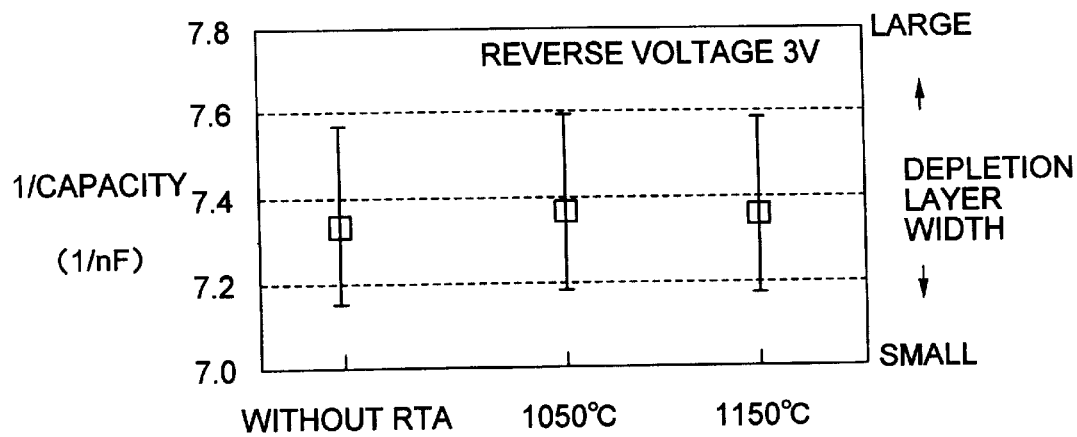

Meanwhile, measurement was made on the influence of RTA temperature on the leakage characteristics and on the impurity profile characteristics. In the measurement, while RTA time was fixed to 30 seconds, cells were manufactured through steps which did not include RTA, include RTA at a temperature of 1050° C. and RTA at a temperature of 1150° C., respectively, and reverse current and junction capacity were measured for the respective cells. FIGS. 7A and 7B show the measurement results. As is obvious from the measurement results, as the temperature is higher, leak current can be suppressed further. As for impurity profile characteristics, the impurity profile is not much dependent on RTA temperature. That is, even if RTA is conducted at higher temperature, the impurity profile characteristics does not deteriorate. Thus, according to the present invention, it is clear that when RTA is conducted at a temperature at least slightly or sufficiently higher than that for forming the device isolation insulating film, it is possible to manufacture a DRAM memory cell causing little leak current without deteriorating impurity profile characteristics, i.e., without deteriorating MOS transistor characteristics. At the time of forming a device isolation insulating film by the LOCOS method, in which heat treatment is normally conducted at a temperature of 800° C. to 1100° C., RTA may be conducted at a temperature higher than 800°C. to 1100° C.

Figure 9A:
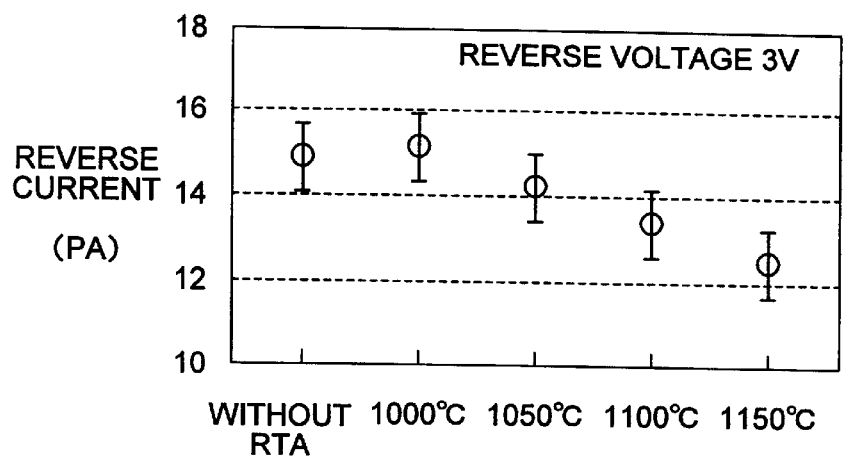
FIGS. 9A and 9B show leakage characteristics and impurity profile characteristics, respectively in case conducting RTA at different temperature in the second embodiment.
Figure 9B:
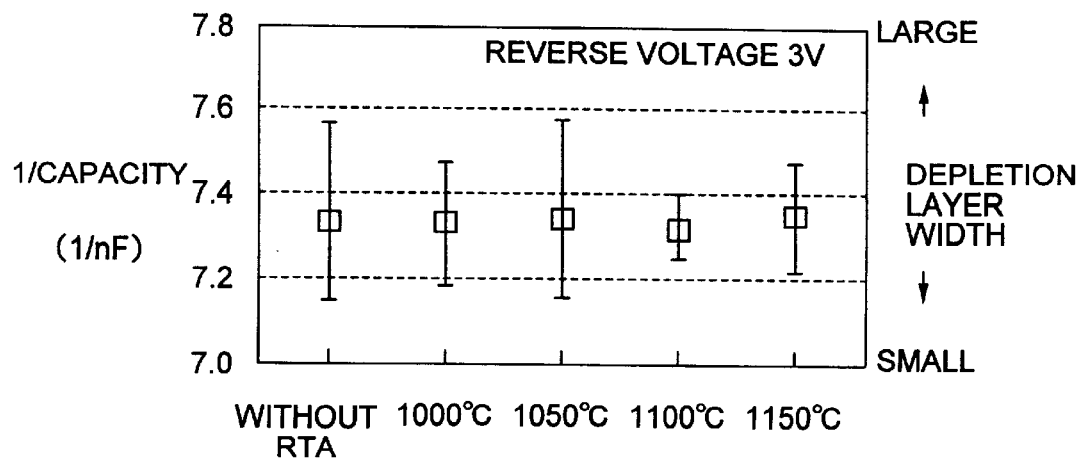

In the above embodiment, the RTA step is conducted immediately after the guard ring is formed. As shown in the flowchart of FIG. 8, however, the RTA step may be conducted immediately after the device isolation insulating film is formed. The flowchart of FIG. 8 differs from that of FIG. 1 only in the order of the RTA step. In FIG. 8, steps corresponding to those in FIG. 1 are denoted by the same reference symbols as those in FIG. 1. FIGS. 9A and 9B show leakage characteristics and impurity profile characteristics in case of forming cells through steps including conducting RTA at different temperatures, i.e., 1000° C., 1050° C., 1100° C. and 1150° C., respectively. In this embodiment as in the case of the first embodiment, leakage characteristics indicate that crystal defects generated on the silicon substrate of the interface between the device isolation insulating film and the silicon substrate can be repaired by RTA and that leak current can be suppressed. According to FIG. 9A, when RTA is conducted at a temperature of 1000° C., the effect of preventing leak current is less than that obtained in case of manufacturing a cell without RTA. It is estimated that this is because the RTA temperature of 1000° C. is almost the same as the temperature of 980° C. for thermal oxidation at the time of forming the device isolation insulating film by the LOCOS method and the temperature is not enough to recover silicon crystal. This indicates that when RTA is conducted immediately after the device isolation insulating film is formed, leak current can be effectively suppressed by setting the RTA temperature slightly higher by, for example, about 50° C. than the temperature for forming the device isolation insulating film. In this case, since neither the guard ring nor the source and drain region for implanting impurity ions is formed before conducting RTA, RTA has little influences on the impurity profile.

Figure 10:
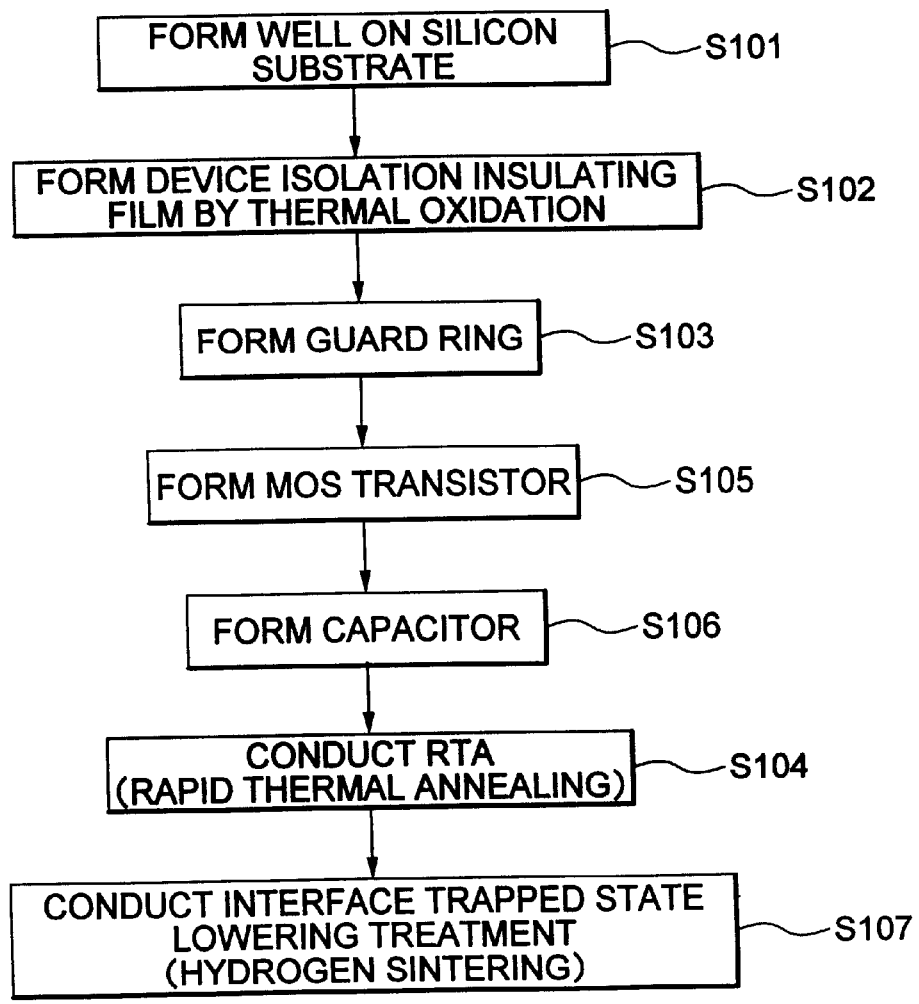
FIG. 10 is a flowchart showing a manufacturing method in a third embodiment according to the present invention.
Figure 11A:
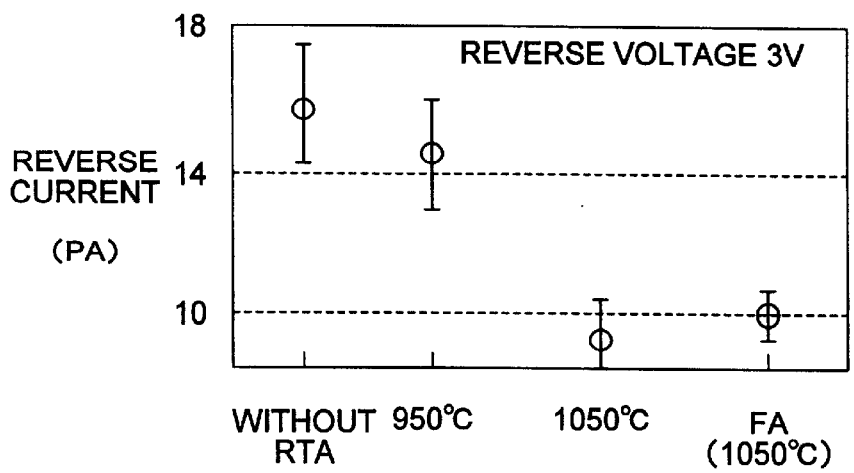
FIGS. 11A and 11B show leakage characteristics and impurity profile characteristics, respectively in case of conducting RTA at different temperatures in the third embodiment.
Figure 11B:
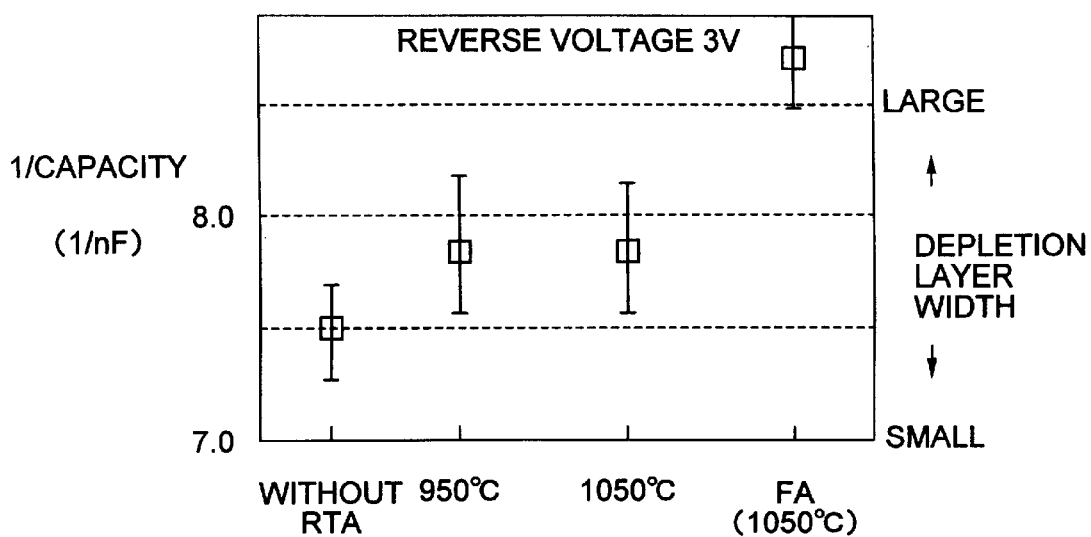

Further, according to the present invention, RTA may be conducted after forming a source and drain region, a MOS transistor and a capacitor, as shown in the flowchart of FIG. 10. In the flowchart of FIG. 10, the equivalent steps to those in FIG. 1 are denoted by the same reference symbols as in FIG. 1. FIGS. 11A and 11B show leakage characteristics and impurity profile characteristics in case of forming cells while RTA is conducted at different temperatures, i.e., 950° C. and 1050° C. In this third embodiment, like the preceding embodiments, the leakage characteristics indicate that crystal defects generated on the silicon substrate of the interface between the device isolation insulating film and the silicon substrate at the time of forming the device isolation insulating film by thermal oxidation can be repaired and leak current can be suppressed by RTA.

Although the effect of preventing leak current can be obtained at the RTA temperature of 950° C. to some extent, a far greater effect can be obtained at the RTA temperature of 1050° C. Meanwhile, as for the impurity profile, since RTA is conducted after the source and drain region is formed, it is impossible to completely ignore the influence of the RTA process on the source and drain region and the depletion layer is slightly wider. This has, however, only a little influence on the MOS transistor characteristics and can be negligible. For reference, FIGS. 11A and 11B also show the leakage characteristics and impurity profile characteristics in case of conducting FA instead of RTA. As shown therein, FA provides almost the same degree of the leak current preventing effect as that for RTA; however, capacity increase in the impurity profile is extremely large, i.e., the depletion layer becomes extremely wider. It is, therefore, estimated that MOS transistor characteristics most likely deteriorates.

Figure 12A:
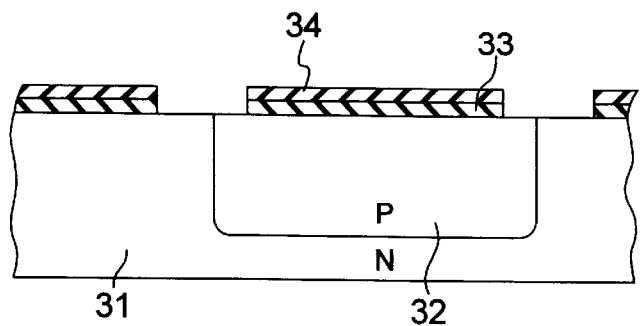
FIGS. 12A through 12D are cross-sectional views showing major steps in a fourth embodiment according to the present invention in the order of steps.

FIGS. 12A through 12D are cross-sectional views for describing the fourth embodiment in which the device isolation insulating film of the present invention is applied to STI (Shallow Trench Isolation). As shown in FIG. 12A, a silicon oxide file 33 and a silicon nitride film 34 are formed on an N-type silicon substrate 31 in which a P-type well region 32 is formed. The silicon nitride film 34 and the silicon oxide film 33 are formed into required patterns, respectively, and an SIT formation region is formed.

Figure 12B:
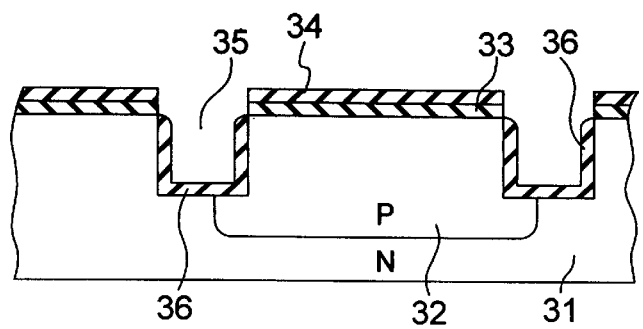

Next, as shown in FIG. 12B, using the silicon nitride film 34 and the silicon oxide film 33 as masks, the silicon substrate 31 is anisotropically etched by a required depth and a depressed groove 35 is formed. Then, the surface of the silicon substrate 31 is thermally oxidized at about 1100° C., thereby forming a silicon oxide film 36 of about 100 Å in thickness on the internal surface of the depressed groove 53.

Figure 12C:
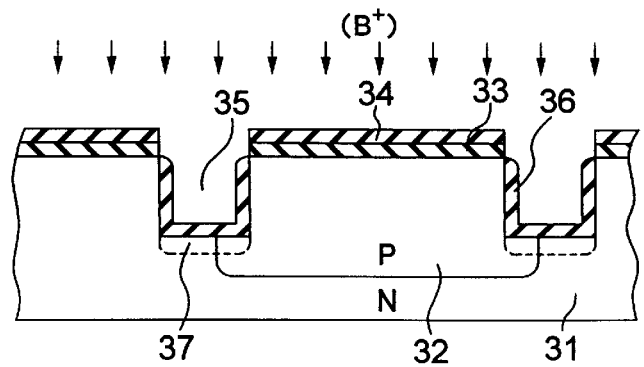

Thereafter, as shown in FIG. 12C, boron ions are implanted into the silicon substrate 31 and a boron ion implanted layer 37 is formed immediately below a silicon oxide film 36 within the depressed groove 35. Since the boron ions are implanted deep in the device isolation region, the implantation does not influence the characteristics of a MOS transistor to be formed later.

RTA process is then carried out to the silicon substrate 31. In the fourth embodiment as in the case of the preceding embodiments, lamp annealing is used as RTA and the silicon substrate 31 is heated for about 30 seconds at a temperature of 1150° C. higher than the temperature at which the device isolation film is formed, i.e., 1100° C. under nitrogen atmosphere. As a result of RTA, crystal defects are repaired at the interface between the silicon oxide film 36 which becomes a device isolation insulating film and the silicon substrate 31 immediately below the silicon oxide film 36 as in the case of the preceding embodiments.

Figure 12D:
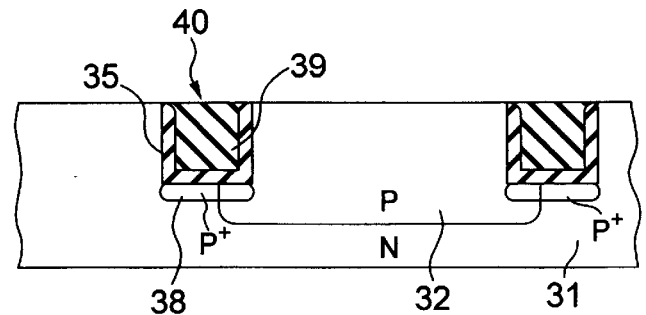

It is noted that after carrying out RTA, the ion implanted layer 37 is formed into a guard ring 38 as a channel stopper as shown in FIG. 12D. Thereafter, a silicon oxide film 39 is deposited on the entire surface of the silicon substrate 31 by a thickness sufficient to completely cover the depressed groove 35 by the CVD method. Further, the surface of the silicon oxide film 39 is etched by the CMP (Chemical Mechanical Polishing) or the etch-back method, thereby flattening the surface of the film 39. Thus, a device isolation insulating film 40 of STI structure in which the silicon oxide films 36 and 39 are embedded, is formed in the depressed groove 35.

Then, although no drawings are given, the silicon nitride film and the silicon oxide film are etched away as in the case of the first embodiment and a gate insulating film, a gate electrode and a source and drain region are formed to thereby form a MOS transistor. Thereafter, an interlayer insulating film is formed, a contact hole is formed, a capacitance electrode, a capacitance insulating film and an opposing electrode are formed to thereby complete a capacitor and hydrogen sintering is conducted. A DRAM memory cell is thus formed. In this embodiment, the guard ring serving as a channel stopper is formed only under the depressed groove. It is also possible to embed the depressed groove with a silicon oxide film and implant ions to thereby simultaneously form highly doped P-type regions both under the depressed groove and in the P-type well region.

The data leakage characteristics of the DRAM memory cell thus formed, i.e., the leakage characteristics immediately below the device isolation insulating film of STI structure as well as the impurity profile for the guard ring and that for the source and drain region were measured. The same measurement results as those in FIG. 5 could be obtained. In this embodiment, the following discovery was made. That is, while the internal surface of the depressed groove formed in the surface of the silicon substrate at the time of forming the device isolation insulating film of STI structure is subjected to oxidation treatment at a temperature of 1100° C., leakage characteristics can be improved by conducting RTA at a temperature of 1150° C. slightly higher than 1100° C. Also, in the fourth embodiment as in the case of the preceding embodiments, it was discovered that RTA has little effect on the impurity profile for the P-type impurity layer forming the guard ring and does not cause the deterioration of MOS transistor characteristics. As is obvious from the above, it was confirmed that according to the present invention, even if the device isolation insulating film is of STI structure, RTA can repair crystal defects at the interface between the device isolation insulating film and the silicon substrate immediately below the device isolation insulating film and suppress leak current. Besides, RTA does not adversely affect the impurity profile.

It is noted that the RTA step should not be limited to the order in which it is conducted immediately after the guard ring is formed. Namely, it was confirmed that the RTA step may be also conducted before the guard ring is formed or after the guard ring and the source and drain region are formed as long as the RTA step is after the step of forming a silicon oxide film in the depressed groove by thermal oxidation. In addition, it was confirmed that if hydrogen sintering is finally carried out, it is possible to suppress leak current in the device isolation insulating film.

Further, even in forming a device isolation insulating film of STI structure, if the temperature at which the internal surface of the depressed groove is thermally oxidized is almost the same as or lower than that in the first embodiment, i.e., 980° C., it is possible to effectively suppress leak current by conducting RTA at a temperature of 1000° C. to 1050° C. as in the case of the first embodiment. In other words, it is possible to repair crystal defects and suppress leak current by conducting RTA at a temperature higher than that for forming a device isolation insulating film by thermal oxidation.

In the embodiments described so far, the present invention is applied to a case of suppressing data leakage in a DRAM memory cell. However, the present invention can be applied to any semiconductor device having a device isolation insulating film formed by the thermal oxidation method and required to reduce leak current immediately below the device isolation insulating film. According to the present invention, it is necessary to conduct RTA after the device isolation insulating film is formed and then conduct hydrogen sintering process to thereby reduce the interface trapped state. Due to this, if the present invention is applied to a semiconductor device manufactured by a method inherently includes a hydrogen sintering step as one of the manufacturing steps, it only suffices to add RTA or replace the conventional FA by RTA. As a result, it is possible to easily manufacture a semiconductor device which leak current is low, without the deterioration of transistor characteristics and without the need to greatly increase the number of manufacturing steps. The above embodiments takes RTA as an example; however, furnace annealing capable of rapidly changing temperature may be employed.

As described so far, according to the present invention, the device isolation insulating film is formed by thermal oxidation, RTA is conducted and then an interface trapped state lowering treatment is conducted. Owing to this, by repairing crystal defects on the semiconductor substrate immediately below the device isolation insulating film and reducing the level of the interface between the device isolation insulating film and the semiconductor substrate, it is possible to reduce leak current which is considered to be resulted from the crystal defects and interface trapped state. If the present invention is applied to a memory cell, in particular, it is possible to suppress data leakage which is considered to be resulted from the leak current on the device isolation insulating film, and to manufacture a high quality memory cell or semiconductor device. Furthermore, RTA, even if conducted, does not make the impurity profile for an impurity layer formed on a semiconductor substrate smooth nor deteriorate the characteristics of a MOS transistor or other devices.

What is claimed is:

1. A semiconductor device manufacturing method comprising:

thermally oxidizing a surface of a semiconductor substrate to form a device isolation insulating film;

conducting a rapid heating treatment to the semiconductor substrate at a temperature higher than a temperature at which the surface of the semiconductor substrate is thermally oxidized;

injecting impurities into the semiconductor substrate; and conducting an interface trapped state lowering treatment.

2. The method according to any one of claim 1, wherein the rapid heating comprises a lamp annealing.

3. The method according to any one of claim 1, wherein the rapid heating comprises an annealing capable of rapidly increasing and decreasing temperature.

4. The method according to any one of claim 1, wherein the temperature at which the thermally oxidized film is formed is between 800° C. and 1100° C. and the rapid heating treatment is conducted at the temperature higher than 950° C. at a speed of increasing and decreasing the temperature of 1° C./second or faster.

5. The method according to any one of claim 1, wherein the forming the device isolation insulating film comprises selectively oxidizing the surface of the semiconductor substrate to form a thick, thermally oxidized film.

6. The method according to any one of claim 1, wherein the forming of the device isolation insulating film comprises forming a depressed groove in the surface of the semiconductor substrate, thermally oxidizing an internal surface and a bottom surface of the depressed groove to thereby form a thermally oxidized film, and embedding an insulating material or other material in the depressed groove.

7. The method according to any one of claim 1, wherein the interface trapped state lowering treatment comprises a low temperature heat treatment using hydrogen.

8. The method according to any one of claim 1, wherein the interface trapped state lowering treatment comprises a heat treatment step.

9. A semiconductor device manufacturing method comprising:

thermally oxidizing a surface of a semiconductor substrate to form a device isolation insulating film;

injecting impurities into the semiconductor substrate;

conducting a rapid heating treatment to the semiconductor substrate at a temperature higher than a temperature at which the surface of the semiconductor substrate is thermally oxidized; and conducting an interface trapped state lowering treatment.

10. The method according to claim 9, wherein the rapid heating comprises a lamp annealing.

11. The method according to claim 9, wherein the rapid heating comprises an annealing capable of rapidly increasing and decreasing temperature.

12. The method according to claim 9, wherein the temperature at which the thermally oxidized film is formed is between 800° C. and 1100° C. and the rapid heating treatment is conducted at the temperature higher than 950° C. at a speed of increasing and decreasing the temperature of 1° C./second or faster.

13. The method according to claim 9, wherein the forming of the device isolation insulating film comprises selectively oxidizing the surface of the semiconductor substrate to form a thick, thermally oxidized film.

14. The method according to claim 9, wherein the forming of the device isolation insulating film comprises forming a depressed groove in the surface of the semiconductor substrate, thermally oxidizing an internal surface and a bottom surface of the depressed groove to thereby form a thermally oxidized film, and embedding an insulating material or other material in the depressed groove.

15. The method according to claim 9, wherein the interface trapped state lowering treatment comprises a low temperature heat treatment using hydrogen.

16. The method according to claim 9, wherein the interface trapped state lowering treatment comprises a heat treatment.

17. A semiconductor device manufacturing method comprising:

forming at least one well region of a conductivity type in a semiconductor substrate;

selectively thermally oxidizing a surface of the semiconductor substrate to form a device isolation insulating film including a thermally oxidized film and forming a device formation region on the semiconductor substrate by the device isolation insulating film;

injecting high concentration impurities of one conductivity type into at least the device isolation insulating film to form a channel stopper immediately below the device isolation insulating film;

forming a gate insulating film and a gate electrode in the device formation region;

injecting impurities of a conductivity type opposite to the conductivity type of the device formation region, using the device isolation insulating film and the gate electrode as masks, to the device formation region and forming a source region and a drain region;

forming an interlayer insulating film covering the device formation region, forming a contact hole in the interlayer insulating film and forming a capacitance electrode electrically connected to the source region through the contact hole;

forming a capacitance insulating film and an opposing electrode on the capacitance electrode to thereby constitute a capacitor;

conducting an interface trapped state lowering treatment to the semiconductor substrate; and conducting a rapid heating treatment to the semiconductor substrate at a temperature higher than a temperature at which the device isolation insulating film is thermally oxidized, the step of conducting a rapid heating treatment being conducted between appropriate steps including any of immediately after the of forming the device isolation insulating film to conducting a low temperature heat treatment under hydrogen atmosphere.

18. The method according to any one of claim 17, wherein the rapid heating treatment step is conducted immediately after the forming of the device isolation insulating film.

19. The method according to any one of claim 17, wherein the rapid heating treatment step is conducted immediately after the forming of the channel stopper.

20. The method according to any one of claim 17, wherein the rapid heating treatment is conducted after forming the source region and drain region.

21. The method according to claim 17, wherein the rapid heating comprises a lamp annealing.

22. The method according to claim 17, wherein the rapid heating comprises an annealing capable of rapidly increasing and decreasing temperature.

23. The method according to claim 17, wherein the temperature at which the thermally oxidized film is formed is between 800° C. and 1100° C. and the rapid heating treatment is conducted at the temperature higher than 950° C. at a speed of increasing and decreasing the temperature of 1° C./second or faster.

24. The method according to claim 17, wherein the forming of the device isolation insulating film comprises selectively oxidizing the surface of the semiconductor substrate to form a thick, thermally oxidized film.

25. The method according to claim 17, wherein the interface trapped state lowering treatment comprises a low temperature heat treatment using hydrogen.

26. The method according to claim 17, wherein the interface trapped state lowering treatment comprises a heat treatment.

* * * * *